United States Patent
Hung et al.

(10) Patent No.: US 9,437,264 B2
(45) Date of Patent: Sep. 6, 2016

(54) MEMORY OPERATION LATENCY CONTROL

(71) Applicant: MACRONIX INTERNATIONAL CO., LTD., Hsinchu (TW)

(72) Inventors: Chun-Hsiung Hung, Hsinchu (TW); Han-Sung Chen, Hsinchu (TW); Ming-Chao Lin, Taichung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 15/055,329

(22) Filed: Feb. 26, 2016

(65) Prior Publication Data

US 2016/0180903 A1    Jun. 23, 2016

Related U.S. Application Data (63) Continuation of application No. 13/854,548, filed on Apr. 1, 2013, now Pat. No. 9,281,021.

(60) Provisional application No. 61/781,014, filed on Mar. 14, 2013.

(51) Int. Cl.
*G11C 8/08* (2006.01)
*G11C 16/30* (2006.01)
*G11C 7/22* (2006.01)

(52) U.S. Cl.
CPC ........................... *G11C 7/22* (2013.01)

(58) Field of Classification Search
CPC ..... G11C 7/08; G11C 7/1042; G11C 7/1039; G11C 7/1045; G11C 7/222; G11C 7/22; G11C 16/0483; G11C 16/0466; G11C 16/32; G11C 2207/2272; G11C 2207/2281
See application file for complete search history.

(56) References Cited

U.S. PATENT DOCUMENTS

| 7,920,429 B2 * | 4/2011 | Chi ..................... G11C 11/4085 365/185.23 |
| 8,995,195 B2 * | 3/2015 | Duzly ..................... G11C 16/10 365/185.18 |

* cited by examiner

*Primary Examiner* — Andrew Q Tran
(74) *Attorney, Agent, or Firm* — Haynes Beffel & Wolfeld LLP (57) ABSTRACT

An integrated circuit with memory can operate with reduced latency between consecutive operations such as read operations. At a first time, a first operation command is finished on a memory array on an integrated circuit. At a second time, a second operation command is begun on the memory array. A regulated output voltage from the charge pump is coupled to word lines in the memory array. From the first time to the second time, a regulated output voltage is maintained at about a word line operation voltage such as a read voltage.

17 Claims, 8 Drawing Sheets

MEMORY OPERATION LATENCY CONTROL

PRIORITY APPLICATIONS

This application is a continuation of U.S. patent application Ser. No. 13/854,548, filed 1 Apr. 2013 entitled Method and apparatus for reduced read latency for consecutive read operations of memory of an integrated circuit, (now U.S. Pat. No. 9,281,021), which application claims the benefit of U.S. Provisional Patent Application No. 61/781,014, filed 14 Mar. 2013. Both applications are incorporated herein by reference.

BACKGROUND

Description of Related Art

A minimum latency occurs between two consecutive operations on a memory array, such as read. The latency includes a setup time for a charge pump to store sufficient charge to set the word line to an operation voltage such as read voltage, and a sensing time for the sense amplifier to detect the data values stored in memory. Unfortunately, it is challenging to improve the speed of a charge pump or a sense amplifier.

SUMMARY

One aspect of the technology is a method of operating an integrated circuit with memory, comprising the following:
- at a first time, finishing a first operation command on a memory array on an integrated circuit;
- at a second time, beginning a second operation command on the memory array; and
- maintaining, from the first time to the second time, a charge pump output voltage at about a word line operation voltage, the charge pump output voltage coupled to word lines in the memory array.

Another aspect of the technology is an integrated circuit, comprising a memory array, a charge pump with a charge pump output coupled to the memory array, and control circuitry coupled to the memory array and the charge pump. The control circuitry maintains a charge pump output voltage at about a word line operation voltage, from a first time of finishing a first operation command on the memory array, to a second time of beginning a second operation command on the memory array.

Another aspect of the technology is a method of operating an integrated circuit with memory, comprising:
- at a first time, finishing a first operation command on a memory array;
- at a second time, beginning a second operation command on the memory array; and
- maintaining a voltage boost circuit output voltage, from the first time of finishing the first operation command on the memory array, to the second time of beginning the second operation command on the memory array.

In one embodiment of the technology, at the first time, the integrated circuit finishes data output from the first operation command.

In one embodiment of the technology, at the second time, the integrated circuit begins receiving a memory address for the second operation command.

In one embodiment of the technology, the first operation command and the second operation command are performed on different word lines in the memory array. Performance of the second operation command can omit a setup period for the charge pump output voltage.

In one embodiment of the technology, the first operation command and the second operation command are performed on a same word line in the memory array. From the first time to the second time the charge pump output voltage can be maintained at about the word line operation voltage for the same word line. Performance of the second operation command can omit both the charge pump and word line voltage setup period.

In various embodiments, the operation command and be a read command, erase command, or program command. In various embodiments, the operation voltage and be a read voltage, erase voltage, or program voltage.

DETAILED DESCRIPTION

Figure 1:
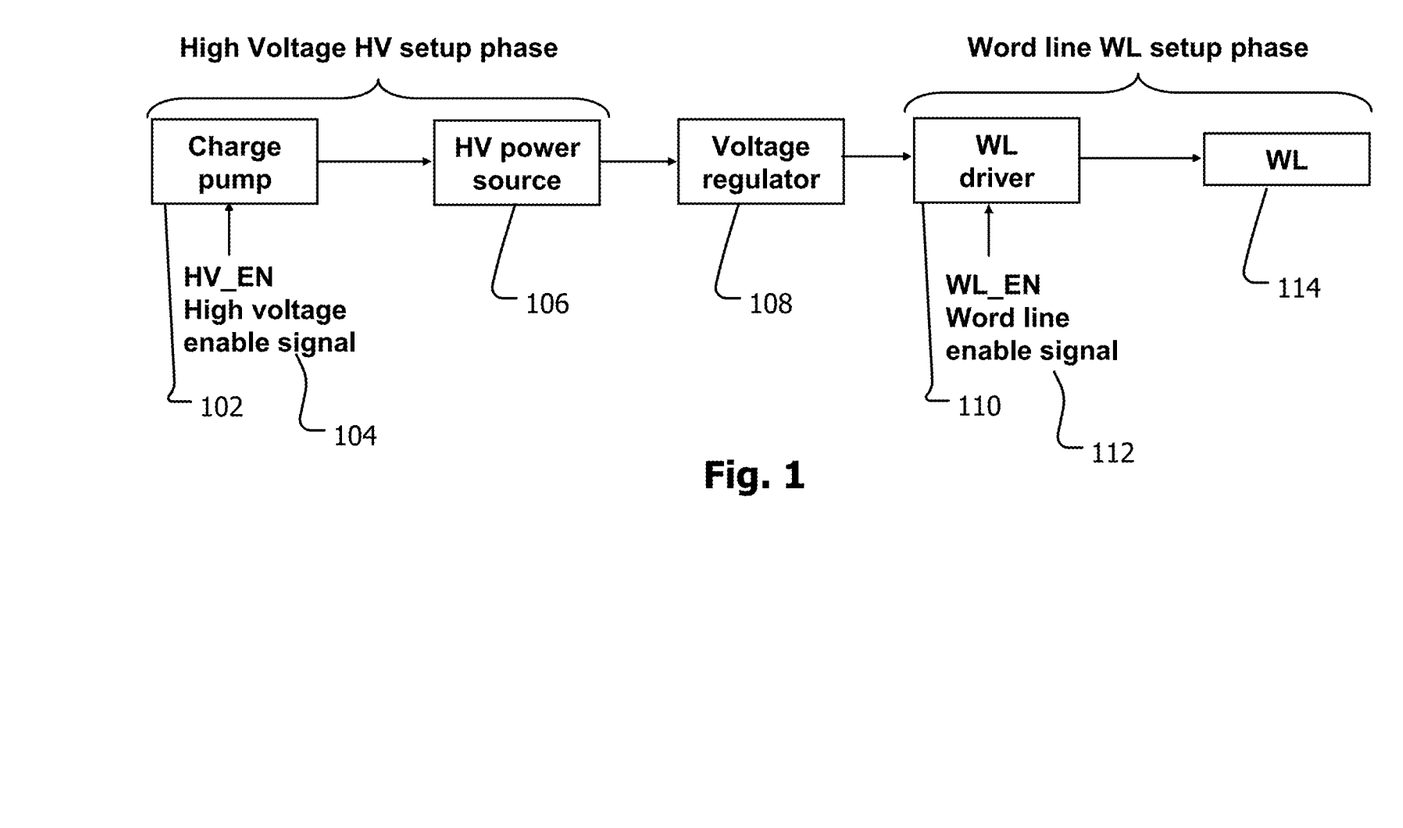
FIG. 1 is a block diagram of a memory circuit showing the HV power and WL level setup path and their control signals.

FIG. 1 is a block diagram of a memory circuit showing the HV power and WL level setup path and their control signals.

The memory circuit includes a high voltage setup part, and a word line setup part. The high voltage setup part of the memory circuit includes charge pump 102 and high voltage power source 106. The charge pump 102 is activated by HV_EN high voltage enable signal 104, and generates a higher voltage than the dc power received by the integrated circuit that is sufficient for performing memory operations. When the charge pump is inactive, the highest readily available voltage is the dc power received by the integrated circuit. A portion of read latency results from the delay associated with charge pumping with the dc power voltage to a high voltage sufficient for memory operations. The higher voltage from charge pumping is provided by HV power source 106.

The charge pump output varies with time, due to charge leakage and periodic charge pumping. The voltage regulator 108 receives the pumped voltage from HV power source 106 and generates a flatter voltage that varies less with time. The output of the voltage regulator 108 can then be used to perform memory operations with predictability.

The word line setup part of the memory circuit includes a word line driver 110 and a word line 114. The word line driver 110 couples particular voltages to and decouples voltages from selected word lines, responsive to signals that indicate a memory operation such as erase, program, or read and that indicate address decoder output that selects or deselects word lines. One such signal is WL_EN word line enable signal 112. The word line 114 is one of an array of word lines that access memory cells in the memory array.

Figure 2:
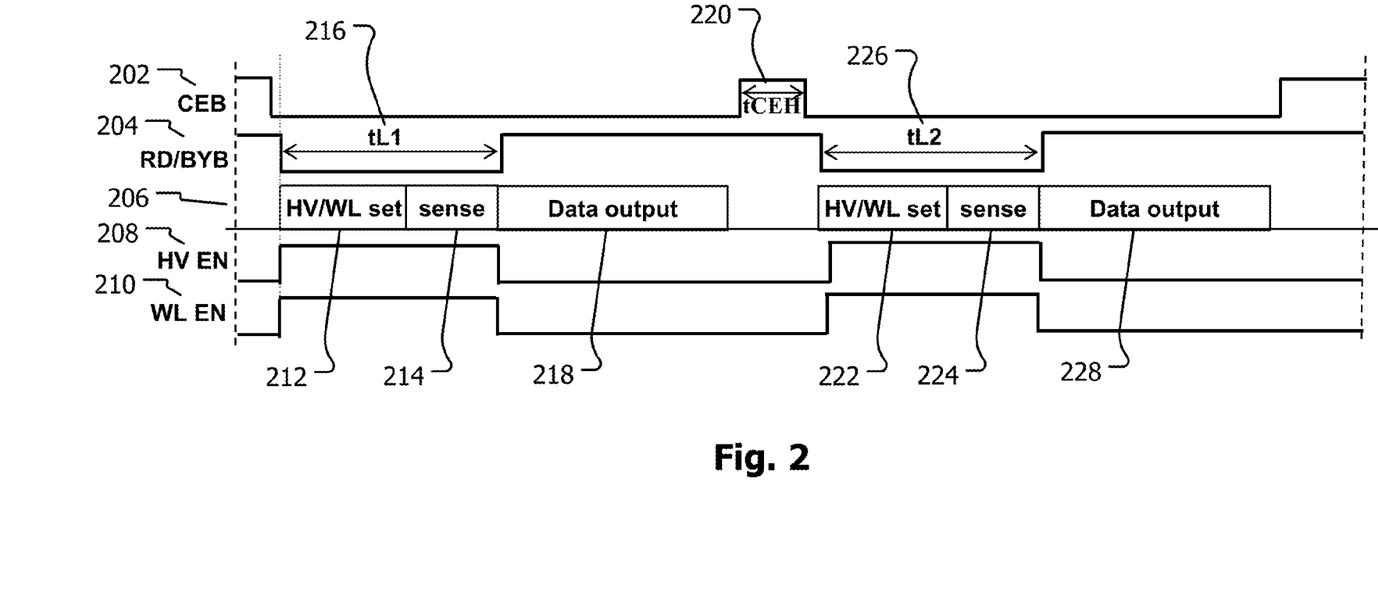
FIG. 2 is a timing diagram for the memory circuit with read latency for consecutive read operations as in FIG. 1.

FIG. 2 is a timing diagram for the memory circuit with read latency for consecutive read operations as in FIG. 1.

Shown are chip enable CEB 202, ready/busy status 204, high voltage enable HV EN 208, and word line enable WL EN 210. Line 206 describes the different phases of the consecutive read operations.

In some embodiments, the read command and address are issued immediately after CEB goes low, although this can vary with manufacturer. RD/BY signal 204 goes high to inform the system that internal sensing is finished. Then the system toggles the read clock (not shown) to strobe data. After data output of the whole page, the system raises CEB high to indicate the end of first read operation. tCEH begins from end of the first read operation, usually CEb high. tCEH ends at initiation of the second read command—which can be CEb going low, or the input of the $2^{nd}$ read command or read command address). In the illustrated embodiment, aligns CEb go low/high to indicate the beginning and end of read operations. In some embodiments, the data output can be incomplete prior to the beginning of the second read operation.

The first read latency of the first read operation is tL1 216, which includes high voltage/word line set 212, and sense 214. After tL1 216, the integrated circuit performs data output 218. The second read latency of the second read operation is tL2 226, which includes high voltage/word line set 222, and sense 224. After tL2 226, the integrated circuit performs data output 228.

After issuing command/address, HV_EN and WL_EN go high to enable pump and set addressed WL from their initial state. HV_EN and WL_EN go low and pump/WL return their initial state once page sensing is completed. Regardless of the length of the period tCEH 220 from completion of data output 218 of the first read operation to beginning tL2 226 of the second read operation, the read latencies tL1 216 and tL2 226 remain the same.

Figure 3:
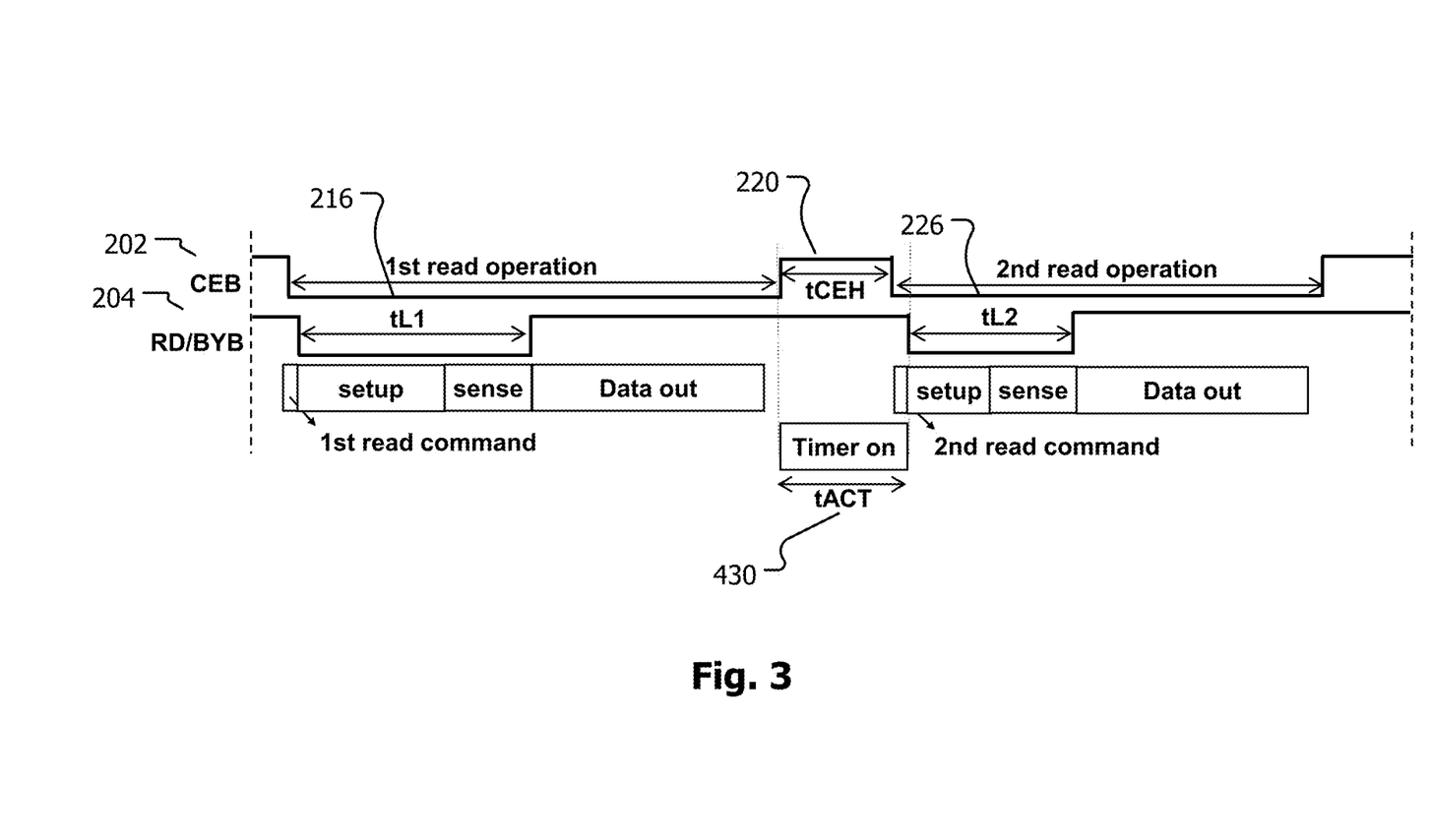
FIG. 3 is a timing diagram for the memory circuit with reduced read latency for consecutive read operations, showing a timer that begins when a first read operation is finished.

FIG. 3 is a timing diagram for the memory circuit with reduced read latency for consecutive read operations, showing a timer that begins when a first read operation is finished.

In addition to the parts that are shared with FIG. 2, the signal tACT timer 430 is shown. A pre-defined period implemented by tACT timer 430 begins at the conclusion of the first read operation. The timeout of signal tACT timer 430 has the same value from operation to operation. However, the period 220 tCEH varies with the beginning of the second read operation controlled by the system.

Figure 4:
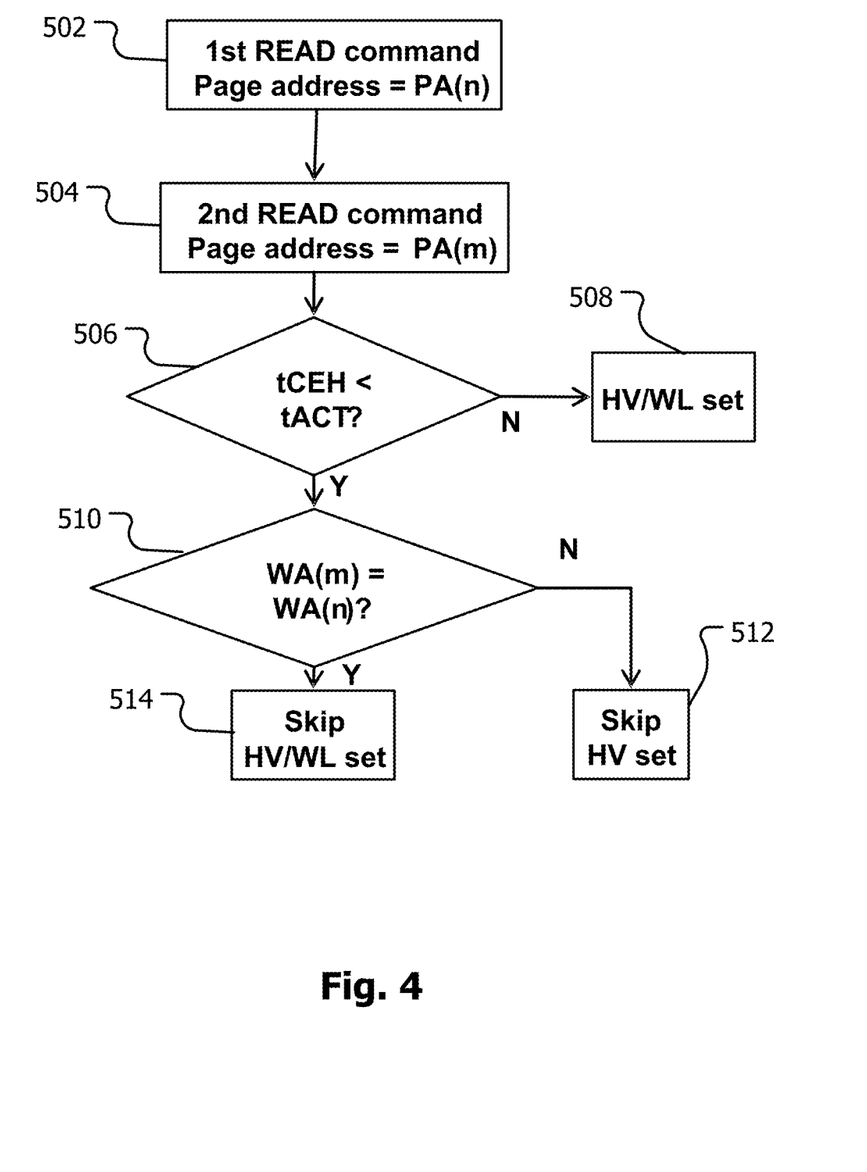
FIG. 4 is a flowchart showing the steps performed by the memory circuit with reduced read latency for consecutive read operations.

FIG. 4 is a flowchart showing the steps performed by the memory circuit with reduced read latency for consecutive read operations.

At 502, a first read command with a read address is received, specifying a page address PA(n). The read WL address is latched or otherwise stored for later comparison with a future read operation's WL address. A read operation is performed on one or more memory cells that are located at page address PA(n), and data output occurs from page address PA(n). At the conclusion of data output, the period tCEH and the timer tACT begin.

At 504, a second read command with a read address is received, specifying a page address PA(m). The period tCEH is determined. At 506, the period tCEH is compared to the timeout of the timer tACT. If the period tCEH is not less than the timeout of the timer tACT, then high voltage/word line voltage set proceed since they have returned to initial state at timeout, so both HV_EN and WL_EN go low. The read latency must account for the charge pump and charging the word line voltage.

However, if the period tCEH is less than the timeout of the timer tACT, then at 510 the word line addresses are compared which correspond to page address PA(m) and page address PA(n). The stored read WL address from the first read command is compared with the word line address of the second read command. A single word line may contain several pages of memory.

If the word line addresses are not equal, then the read latency can be shortened, due to elimination of the charge pump setting 512. HV power is maintained, so HV_EN is kept high. However, because a new word line must be charged, the word line is set. WL_EN goes low to discharge the first read WL, and then WL_EN goes high to setup the second read WL As shown by contrasting FIGS. 5 and 6, the read latency tL2x<tL2, due to the elimination of the charge pump setting 512.

If the word line addresses are equal, then the read latency can be further shortened, due to elimination of both the charge pump delay and the word line set 514. Both HV_EN and WL_EN are kept high. Both HV power and WL maintain their levels. As shown by contrasting FIGS. 5 and 6, the read latency tL2y<tL2, due to the elimination of both the charge pump delay and the word line set 514.

Figure 5:
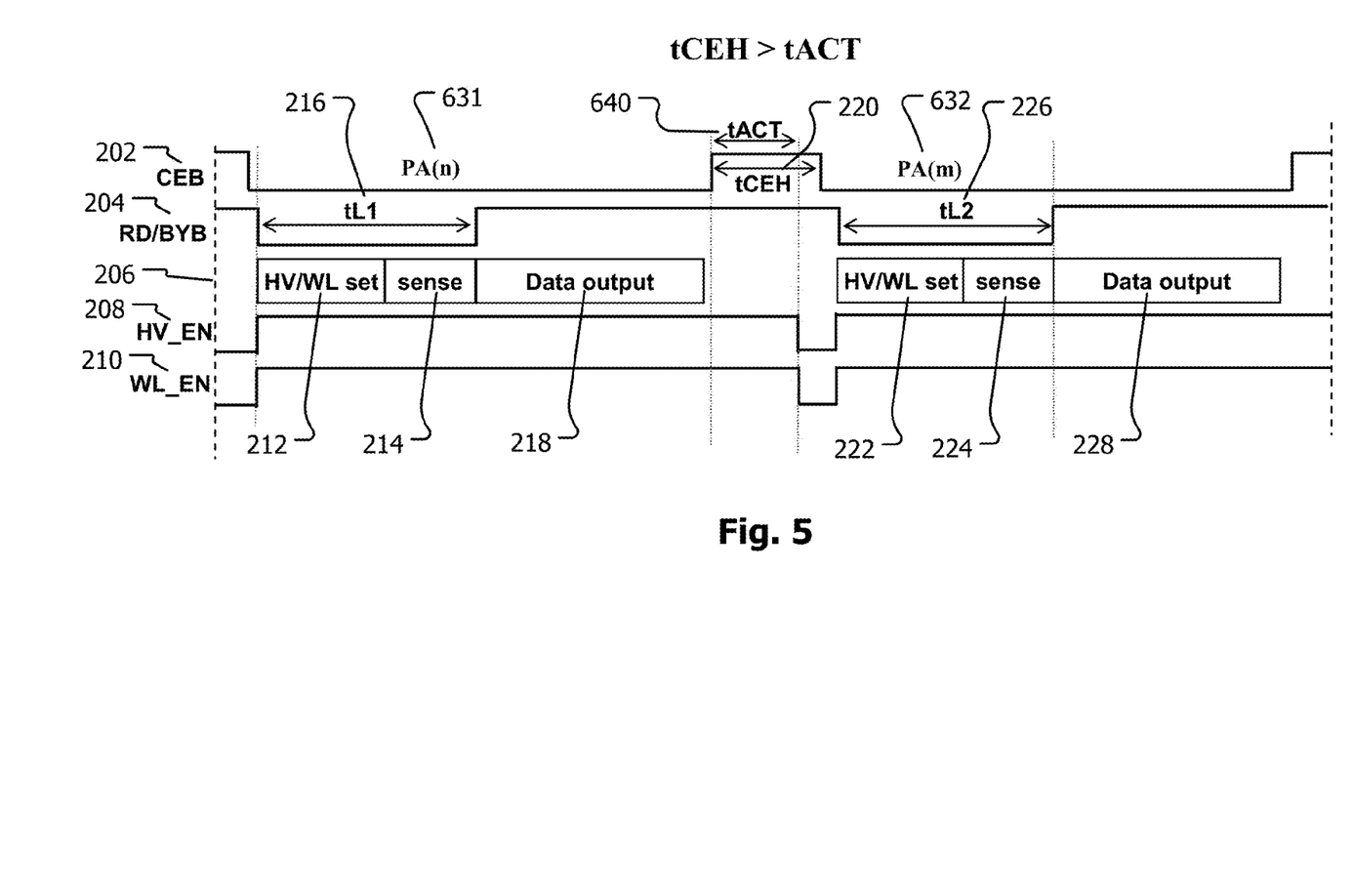
FIG. 5 is a timing diagram for the memory circuit with reduced read latency for consecutive read operations adding more detail to FIG. 3, showing the case when the period between the two read operations is longer than the timeout of the timer.

FIG. 5 is a timing diagram for the memory circuit with reduced read latency for consecutive read operations adding more detail to FIG. 3, showing the case when the period between the two read operations 220 is longer than the timeout of the timer 640. The timing diagram of FIG. 5 corresponds to outcome 508 of FIG. 4. HV_EN and WL_EN go low, and the pump and WL return to their initial state at timeout. Full HV and WL setup timing are required for the $2^{nd}$ page read operation. Accordingly, the read latency tL2 226 is relatively long.

Figure 6:
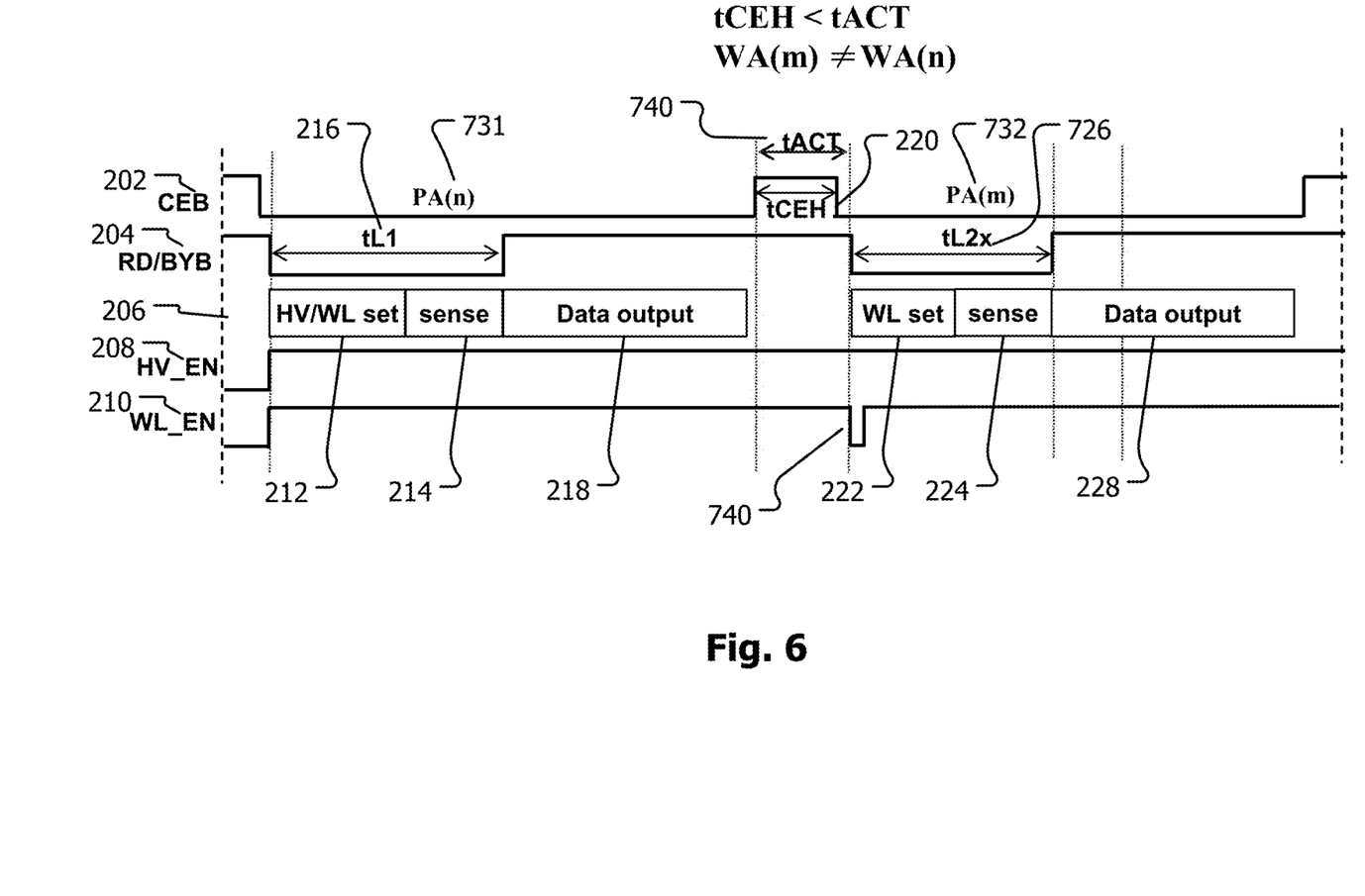
FIG. 6 is a timing diagram for the memory circuit with reduced read latency for consecutive read operations adding more detail to FIG. 3, showing the case when the period between the two read operations is shorter than the timeout of the timer, and the word lines addressed by the two read operations are different.

FIG. 6 is a timing diagram for the memory circuit with reduced read latency for consecutive read operations adding more detail to FIG. 3, showing the case when the period between the two read operations 220 is shorter than the timeout of the timer 740, and the word lines addressed by the two read operations are different. The timing diagram of FIG. 6 corresponds to outcome 512 of FIG. 4. HV_EN keeps high to maintain HV power. WL_EN goes low to discharge the first read WL and then goes high to setup the second read WL. The read latency tL2x 726<tL2 226, due to the elimination of the charge pump setting.

Figure 7:
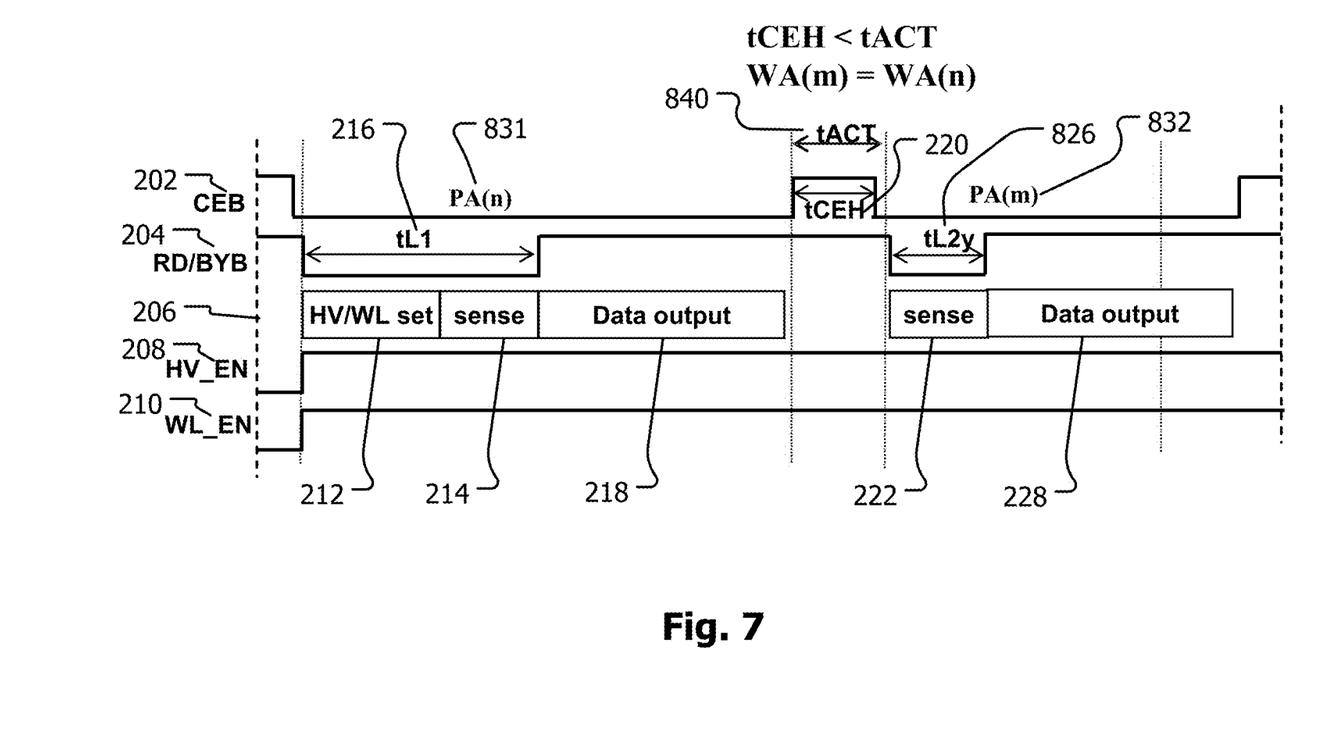
FIG. 7 is a timing diagram for the memory circuit with reduced read latency for consecutive read operations adding more detail to FIG. 3, showing the case when the period between the two read operations is shorter than the timeout of the timer, and the same word line is addressed by the two read operations.

FIG. 7 is a timing diagram for the memory circuit with reduced read latency for consecutive read operations adding more detail to FIG. 3, showing the case when the period between the two read operations 220 is shorter than the timeout of the timer 840, and the same word line is addressed by the two read operations. The timing diagram of FIG. 7 corresponds to outcome 514 of FIG. 4. Both HV_EN and WL_EN stay high. HV power and WL all maintain their levels. The read latency tL2y 826<tL2, due to the elimination of both the charge pump delay and the word line set.

Figure 8:
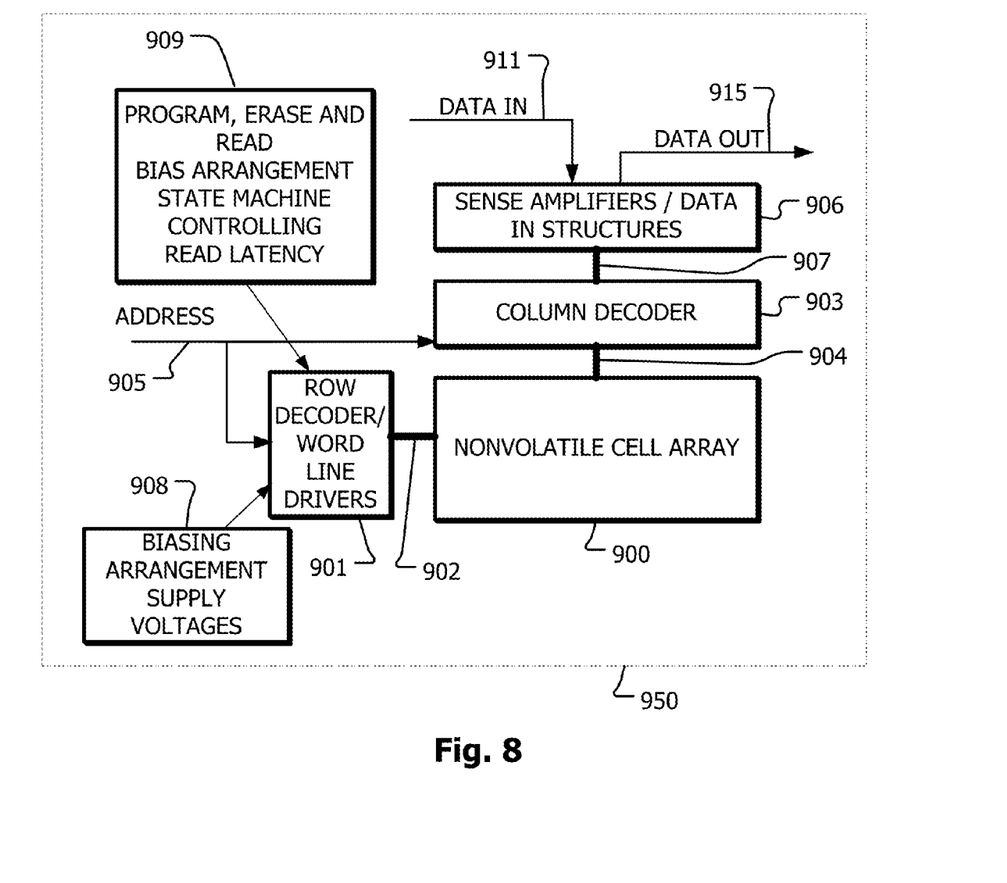
FIG. 8 is a block diagram of the memory circuit with reduced read latency for consecutive read operations.

FIG. 8 is a block diagram of the memory circuit with reduced read latency for consecutive read operations.

An integrated circuit 950 includes a memory array 900. A word line decoder and word line drivers 901 is coupled to, and in electrical communication with, a plurality of word lines 902, and arranged along rows in the memory array 900. A bit line decoder and drivers 903 are coupled to and in electrical communication with a plurality of bit lines 904 arranged along columns in the memory array 900 for reading data from, and writing data to, the memory cells in the memory array 900. Addresses are supplied on bus 905 to the word line decoder and drivers 901 and to the bit line decoder 903. Sense amplifiers and data-in structures in block 906, are coupled to the bit line decoder 903 via the bus 907. Data is supplied via the data-in line 911 from input/output ports on the integrated circuit 950, to the data-in structures in block 906. Data is supplied via the data-out line 915 from the sense amplifiers in block 906 to input/output ports on the integrated circuit 950, or to other data destinations internal or external to the integrated circuit 950. Program, erase, and read bias arrangement state machine circuitry 909 controls read latency, controls the timeout timer between consecutive read operations, and determines the components of read latency.

The duration of the timer timeout tACT is a balance between reduced read latency between consecutive read operations, and power conservation. On the one hand, if the timer timeout tACT is too short, the read latency is rarely shortened. On the other hand. If the timer timeout tACT is too long, then power is wasted due to leakage from the continually pumped nodes. Some example periods of the timer timeout tACT are in the single digits of microseconds, to tens of microseconds.

The described technology is useful for both data flash-type NAND memory and code flash-type NOR memory. However, greater read latency reduction tends to occur with NAND type memory than NOR type memory, because of the greater likelihood of performing continuous read operations on NAND type memory.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating an integrated circuit with memory, comprising:
   performing a first operation on a memory array; and
   in response to a read command sequence after said first operation, performing a first read operation characterized by a first latency or performing a second read operation characterized by a second read latency, the first read operation being performed if a time delay between the first operation and the read command sequence is not less than a timing parameter, the second read operation being performed if said time delay is less than the timing parameter.

2. The method of claim 1, including measuring a time between an end of the first operation and initiation of the read command sequence to determine the time delay.

3. The method of claim 1, wherein the end of the first operation used to determine the time delay is indicated by a toggle of a chip enable signal.

4. The method of claim 3, wherein an initiation of the read command sequence used to determine the time delay is indicated by a subsequent toggle of said chip enable signal.

5. The method of claim 1, wherein the first read operation includes a first sequence of steps and the second read operation includes a second sequence of steps that is different from the first sequence of steps.

6. The method of claim 5, wherein the first sequence includes a charge pump setup, a word line setup, and sense amplifier sensing.

7. The method of claim 5, wherein the second sequence does not include a charge pump setup, and includes a word line setup and sense amplifier sensing.

8. The method of claim 5, wherein the second sequence does not include a charge pump setup and a word line setup, and includes sense amplifier sensing.

9. An integrated circuit, comprising:
   a memory array; and
   control circuitry coupled to the memory array, wherein the control circuitry:
      in response to a read command sequence, performing a first read operation characterized by a first latency or performing a second read operation characterized by a second read latency, the first read operation being performed if the time delay between a previous operation and the read command sequence is less than a timing parameter, the second read operation being performed if said time delay is not less than the timing parameter.

10. The integrated circuit of claim 9, including a timer measuring a time between an end of the previous operation and initiation of the read command sequence to determine the time delay.

11. The integrated circuit of claim 9, wherein the timer is responsive to a toggle of a chip enable signal to indicate an end of the previous operation.

12. The integrated circuit of claim 11, wherein the timer is responsive to a subsequent toggle of the chip enable signal to indicate initiation of the read command sequence.

13. The integrated circuit of claim 9, wherein the first read operation includes a first sequence of steps and the second read operation includes a second sequence of steps that is different from the first sequence of steps.

14. The integrated circuit of claim 13, wherein the first sequence includes a charge pump setup, a word line setup, and sense amplifier sensing.

15. The integrated circuit of claim 13, wherein the second sequence does not include a charge pump setup, and includes a word line setup and sense amplifier sensing.

16. The integrated circuit of claim 13, wherein the second sequence does not include a charge pump setup and a word line setup, and includes sense amplifier sensing.

17. A method of operating an integrated circuit with memory, comprising:
   performing a first read operation on a memory array in response to a first read command sequence initiated at a first time, the first read operation characterized by a first read latency; and
   in response to a second read command sequence initiated at a second time, the second time occurring after the first read operation terminates, performing a second read operation characterized by a second read latency less than the first read latency, if a time difference between an end of the first read operation and the second time is less than a timing parameter, else performing said first read operation.

* * * * *